(12) United States Patent
Wagner et al.

(10) Patent No.: US 12,314,597 B2
(45) Date of Patent: May 27, 2025

(54) ADAPTIVE SRAM MEMORY CONTROL

(71) Applicant: International Business Machines Corporation, Armonk, NY (US)

(72) Inventors: Israel A. Wagner, Zichron Yaakov (IL); Yevgeniy Kuklin, Bney Aish (IL); Noam Jungmann, Holon (IL)

(73) Assignee: International Business Machines Corporation, Armonk, NY (US)

( * ) Notice: Subject to any disclaimer, the term of this patent is extended or adjusted under 35 U.S.C. 154(b) by 590 days.

(21) Appl. No.: 17/157,609

(22) Filed: Jan. 25, 2021

(65) Prior Publication Data

US 2022/0236905 A1  Jul. 28, 2022

(51) Int. Cl.
*G06F 3/00* (2006.01)
*G06F 3/06* (2006.01)

(52) U.S. Cl.
CPC .......... *G06F 3/0655* (2013.01); *G06F 3/0604* (2013.01); *G06F 3/0673* (2013.01)

(58) Field of Classification Search
CPC ..... G06F 3/0655; G06F 3/0604; G06F 3/0673
See application file for complete search history.

(56) References Cited

U.S. PATENT DOCUMENTS

| | | | | |
|---|---|---|---|---|
| 6,256,703 B1* | 7/2001 | Feierbach | ............ | G11C 7/1045 711/106 |
| 2002/0176302 A1* | 11/2002 | Jung | .................. | G11C 11/4094 365/222 |
| 2005/0273587 A1* | 12/2005 | Wynn | ..................... | G06F 9/442 711/170 |
| 2006/0245272 A1* | 11/2006 | Hartono | ................... | G11C 7/22 365/189.07 |
| 2017/0206947 A1 | 7/2017 | Affleck et al. | | |
| 2019/0007049 A1 | 1/2019 | Wu | | |
| 2019/0384528 A1 | 12/2019 | Grosz et al. | | |
| 2020/0041355 A1 | 2/2020 | Bahirat et al. | | |

OTHER PUBLICATIONS

Lee et al., "Adaptive-latency DRAM: Optimizing DRAM timing for the common-case," IEEE 21st International Symposium on High Performance Computer Architecture, 2015, 13 pages, retrieved from https://www.semanticscholar.org/paper/Adaptive-latency-DRAM%3A-Optimizing-DRAM-timing-for-Lee-Kim/0d4840c8d5da113a968f5ba9daeb5576e4d38793.

* cited by examiner

*Primary Examiner* — Craig S Goldschmidt
(74) *Attorney, Agent, or Firm* — Zilka-Kotab, P.C.

(57) ABSTRACT

A method, system and product including adapting a value of a delay parameter that is utilized in an operation of a memory-cell array, wherein the delay parameter influences a ratio between an operation portion of a clock cycle and a pre-charge portion of the clock cycle, wherein writing or reading to the memory-cell array is enabled during the operation portion of the clock cycle and is disabled during the pre-charge portion of the clock cycle, wherein said adapting comprises: initializing the delay parameter with an initial value; writing a first test data into the memory-cell array; attempting to read from the memory-cell array a second test data; comparing the first test data with the second test data; and selecting a target value for the delay parameter based on said comparing.

20 Claims, 6 Drawing Sheets

ADAPTIVE SRAM MEMORY CONTROL

TECHNICAL FIELD

The present disclosure relates to a semiconductor memory device in general, and to methods, systems and products for adapting timing parameters of a semiconductor memory device, in particular.

BACKGROUND

Semiconductor memory devices typically comprise Static Random Access Memory (RAM) (SRAM) memory cells, Dynamic Random Access Memory (RAM) (DRAM) memory cells, or the like. An SRAM may be considered a significant memory device due to its high speed, low power consumption, and simple operation. Unlike a DRAM memory cell, the SRAM memory cells do not need to be regularly refreshed.

BRIEF SUMMARY

One exemplary embodiment of the disclosed subject matter is a method comprising: adapting a value of a delay parameter that is utilized in an operation of a memory-cell array, wherein the delay parameter influences a ratio between an operation portion of a clock cycle and a pre-charge portion of the clock cycle, wherein writing or reading to the memory-cell array is enabled during the operation portion of the clock cycle and is disabled during the pre-charge portion of the clock cycle, wherein said adapting comprises: initializing the delay parameter with an initial value; writing a first test data into the memory-cell array; attempting to read from the memory-cell array a second test data; comparing the first test data with the second test data; and selecting a target value for the delay parameter based on said comparing.

Optionally, the first test data is written into a memory address of the memory-cell array, and the second test data is attempted to be read from the memory address.

Optionally, the method comprises, in case the first test data is determined to be identical to the second test data, performing said selecting at least by iteratively: repeating a plurality of times said attempting to read and said comparing using the value of the delay parameter, and decreasing the delay parameter value to obtain a decreased operation period until said comparing results in a mismatch. Upon identifying that said comparing results in the mismatch, said selecting comprises: increasing the value of the delay parameter, and verifying that the value is reliable by repeating a plurality of times said attempting to read and said comparing using the value of the delay parameter, thereby preventing hysteresis behavior.

Optionally, the method comprises, in case the first test data is not identical to the second test data, performing said selecting at least by: increasing the delay parameter value to obtain an increased operation period, and repeating a plurality of times said attempting to read and said comparing using the increased operation period.

Optionally, the delay parameter represents a delay of a control signal associated with the clock cycle.

Optionally, the control signal is a sense amplifier control signal.

Optionally, the method is performed during runtime of a device housing the memory-cell array, wherein the runtime is after a testing phase of the device.

Optionally, the method is performed at a device housing the memory-cell array and one or more additional memory-cell arrays, wherein said adapting is further performed for each of the one or more additional memory-cell arrays.

Optionally, said adapting is performed in response to an instruction from a user of a computing device comprising the memory-cell array.

Optionally, the initial value comprises a maximal value of the delay parameter.

Optionally, the memory-cell array is part of a Random-access memory (RAM), a Static RAM (SRAM), or the like.

Another exemplary embodiment of the disclosed subject matter is a computer program product comprising a non-transitory computer readable storage medium retaining program instructions, which program instructions when read by a processor, cause the processor to: adapt a value of a delay parameter that is utilized in an operation of a memory-cell array, wherein the delay parameter influences a ratio between an operation portion of a clock cycle and a pre-charge portion of the clock cycle, wherein the clock cycle comprises the operation portion and the pre-charge portion, wherein writing or reading to the memory-cell array is enabled during the operation portion of the clock cycle and is disabled during the pre-charge portion of the clock cycle, wherein said adapt comprises: initialize the delay parameter with an initial value; write a first test data into the memory-cell array; during a reading period that is not longer than the operation portion of the clock cycle, attempt to read from the memory-cell array a second test data; compare the first test data with the second test data; and select a target value for the delay parameter based on said compare.

Optionally, the instructions, when read by the processor, cause the processor to write the first test data into a memory address of the memory-cell array, and to read the second test data from the memory address.

Optionally, the instructions, when read by the processor, cause the processor to, in case the first test data is determined to be identical to the second test data, perform said selecting at least by iteratively: repeating a plurality of times said attempting to read and said comparing using the value of the delay parameter, and decreasing the delay parameter value to obtain a decreased operation period until said comparing results in a mismatch. Upon identifying that said comparing results in the mismatch, said selecting comprises: increasing the value of the delay parameter, and verifying that the value is reliable by repeating a plurality of times said attempting to read and said comparing using the value of the delay parameter, thereby preventing hysteresis behavior.

Optionally, the instructions, when read by the processor, cause the processor to, in case the first test data is not identical to the second test data, perform said selecting at least by: increasing the delay parameter value to obtain an increased operation period, and repeating a plurality of times said attempting to read and said comparing using the increased operation period.

Optionally, the delay parameter represents a delay of a control signal associated with the clock cycle.

Optionally, the control signal is a sense amplifier control signal.

Optionally, the instructions, when read by the processor, cause the processor to perform said adapting in response to an instruction from a user of a computing device comprising the memory-cell array.

Optionally, the initial value comprises a maximal value of the delay parameter.

Optionally, the memory-cell array is part of a RAM, an SRAM, or the like.

Yet another exemplary embodiment of the disclosed subject matter is a system comprising a processor and coupled memory, the processor being adapted to: adapt a value of a delay parameter that is utilized in an operation of a memory-cell array of the coupled memory, wherein the delay parameter influences a ratio between an operation portion of a clock cycle and a pre-charge portion of the clock cycle, wherein the clock cycle comprises the operation portion and the pre-charge portion, wherein writing or reading to the memory-cell array is enabled during the operation portion of the clock cycle and is disabled during the pre-charge portion of the clock cycle, wherein said adapt comprises: initialize the delay parameter with an initial value; write a first test data into the memory-cell array; during a reading period that is not longer than the operation portion of the clock cycle, attempt to read from the memory-cell array a second test data; compare the first test data with the second test data; and select a target value for the delay parameter based on said compare.

Optionally, the processor is adapted to write the first test data into a memory address of the memory-cell array, and to read the second test data from the memory address.

Optionally, the processor is adapted to, in case the first test data is determined to be identical to the second test data, perform said selecting at least by iteratively: repeating a plurality of times said attempting to read and said comparing using the value of the delay parameter, and decreasing the delay parameter value to obtain a decreased operation period until said comparing results in a mismatch. Upon identifying that said comparing results in the mismatch, said selecting comprises: increasing the value of the delay parameter, and verifying that the value is reliable by repeating a plurality of times said attempting to read and said comparing using the value of the delay parameter, thereby preventing hysteresis behavior.

Optionally, the processor is adapted to, in case the first test data is not identical to the second test data, perform said selecting at least by: increasing the delay parameter value to obtain an increased operation period, and repeating a plurality of times said attempting to read and said comparing using the increased operation period.

Optionally, the delay parameter represents a delay of a control signal associated with the clock cycle.

Optionally, the control signal is a sense amplifier control signal.

Optionally, the processor is adapted to perform said adapt the value during runtime of a device housing the coupled memory, wherein the runtime is after a testing phase of the device.

Optionally, the coupled memory comprises the memory-cell array and one or more additional memory-cell arrays, wherein the processor is adapted to perform said adapt the value for each of the one or more additional memory-cell arrays.

Optionally, said adapt is performed in response to an instruction from a user of a computing device comprising the coupled memory.

Optionally, the initial value comprises a maximal value of the delay parameter.

Optionally, the coupled memory comprises a RAM, an SRAM, or the like.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

One technical problem dealt with by the disclosed subject matter is enhancing a memory access performance of Static Random Access Memory (RAM) (SRAM) memory cell arrays, e.g., without compromising on reliability. In some exemplary embodiments, semiconductor memory devices may comprise integrated circuit chips such as SRAM, Dynamic RAM (DRAM), Read Only Memory (ROM), or the like. In some exemplary embodiments, DRAM memory may be generally slower to access than SRAM or ROM, but may consume less power than SRAM. In some exemplary embodiments, SRAM memory may require a larger device count per stored data bit, which enables it to provide faster access than DRAMs, at the expense of higher power consumption.

In some exemplary embodiments, typically, SRAM memory cells store logical "1"s or "0"s by using two cross-coupled inverters that create a stable loop. For example, the loop can be fed a logic 1 at the input of the first inverter, which turns into a 0 at its output, and is fed into the second inverter which transforms that logic 0 back to a logic 1, feeding back the same value to the input of the first inverter, or vice versa. In some exemplary embodiments, this creates a stable 0 or 1 state that does not change over time, e.g., as long as the loop has continuous power supply. In some exemplary embodiments, SRAM memory cells may comprise any alternative structure, e.g., comprising additional or fewer transistors per bit, inverters, or the like. In some exemplary embodiments, access to SRAM memory cells may be enabled by a wordline controlling a connection of a cell to both his bitlines. In some exemplary embodiments, two bitlines of an SRAM cell may be used for transferring data to perform read or write operations, e.g., based on a difference between the bitlines' voltages.

In some exemplary embodiments, at every clock cycle, SRAM circuits may be idle, reading or writing. In some exemplary embodiments, each reading or writing state may coarsely comprise a pre-charge portion, in which the bitlines of a cell are equally charged by way of a pre-charge function or an auto-pre-charge command, e.g., to prepare the array circuits for an operation, and an operation period, in which the target wordline and the sense amplifier are activated. In some exemplary embodiments, clock cycles may provide control signals controlling the timing of each operation, timing ratios in the memory array operation, or the like. In some exemplary embodiments, each clock cycle may dictate a timing of the pre-charge process, a timing of the wordline activation, a timing of the sense amplifier activation, or the like, e.g., by generating corresponding triggers, control signals, or the like.

Figure 1:
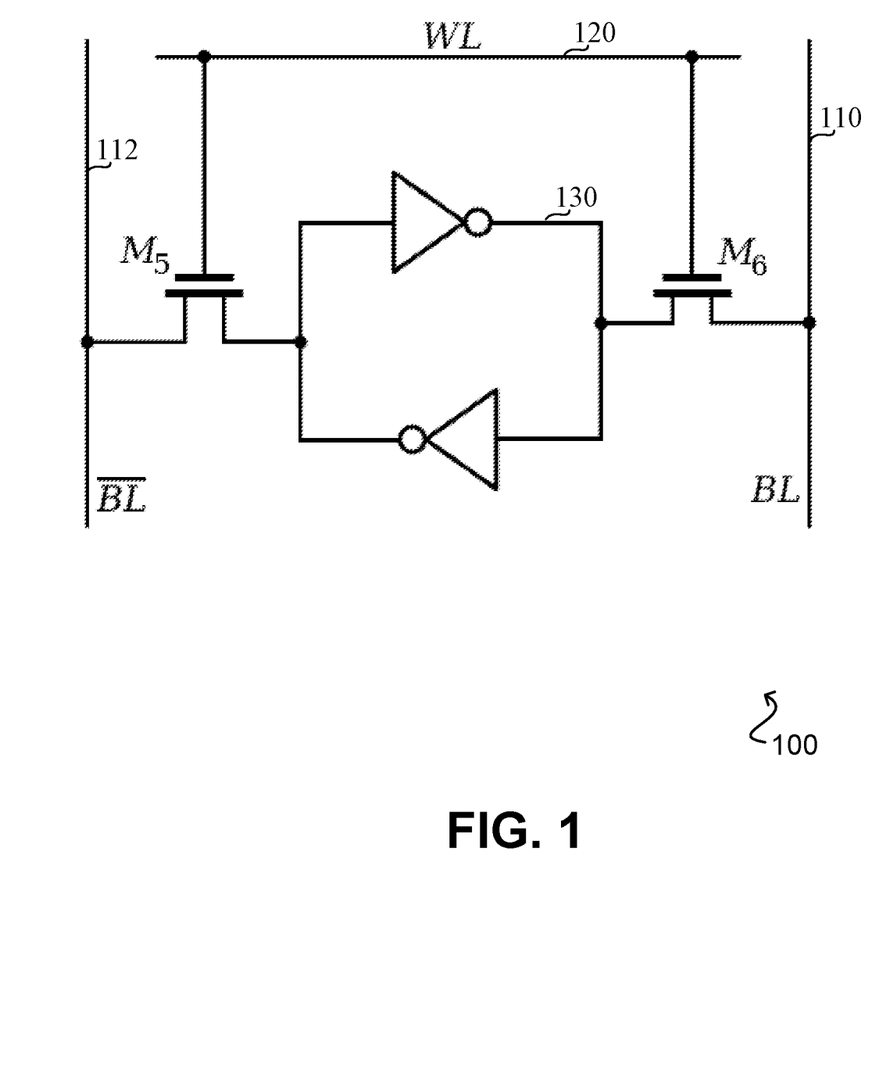
FIG. 1 shows a schematic illustration of an exemplary Static Random-access memory (RAM) (SRAM) Memory Cell, in accordance with some exemplary embodiments of the disclosed subject matter.

Referring now to FIG. 1 showing an illustration of an exemplary SRAM Memory Cell 100, in accordance with some exemplary embodiments of the disclosed subject matter.

In some exemplary embodiments, as illustrated in FIG. 1, Cell 100 comprises Bitlines 110 and 112, a Wordline 120, a stable Loop 130 including two cross-coupled inverters, and two transistor (denoted M5, M6) that enable to connect or disconnect Loop 130 from Bitlines 110 and 112. In some exemplary embodiments, at every clock cycle, Cell 100 may be idle (standby state), or engaged with a reading or writing operation. In some exemplary embodiments, in all states, the inverters of Loop 130 may continue to reinforce each other as long as they are connected to a power supply.

In some exemplary embodiments, each reading or writing operation may comprise an operation period, in which first Wordline 120 and then the sense amplifier (not illustrated) are activated. In some exemplary embodiments, in order to perform a reading or writing operation, a pre-charge process is required, in which Bitlines 110 and 112 are charged equally, e.g., are set to a logical 1. In some exemplary embodiments, pre-charging Bitlines 110 and 112 to an equal voltage may ensure that future gaps or deltas between voltages of Bitlines 110 and 112 can be identified swiftly by the sense amplifier (not illustrated) of Cell 100, which acts as a voltage comparator. In some exemplary embodiments, the sense amplifier may be configured to amplify and compare the voltages of Bitlines 110 and 112, and identify a stored value based on an ordered difference between the voltages. In some exemplary embodiments, during idle cycles, the M5 and M6 transistors may disconnect Loop 130 from Bitlines 110 and 112. In some exemplary embodiments, during active cycles, the M5 and M6 transistors may reconnect Loop 130 to Bitlines 110 and 112.

In some exemplary embodiments, during a read cycle, Wordline 120 may be asserted to enable both the access transistors M5 and M6, thereby causing a voltage of one of the bitlines, e.g., Bitlines 110 or 112, that is connected to the logical 0 part of Loop 130, to slightly drop. In some exemplary embodiments, the slight drop may cause Bitlines 110 and 112 to develop a voltage difference, so that the sense amplifier will sense which line has the higher voltage and thus determine whether the stored value was 1 or 0.

In some exemplary embodiments, in order to perform a write operation, Wordline 120 may be asserted so that a target value is captured and latched in. In some exemplary embodiments, during the write cycle, the target value may be applied to one of the bitlines, e.g., Bitlines 110 or 112. In some exemplary embodiments, an opposite value may be applied to the remaining bitline. For example, the target value may be applied to Bitline 110 and the opposite value may be applied to Bitline 112, or vice versa, thereby enabling to overwrite the value retained by Loop 130.

In some exemplary embodiments, a pre-charge control signal may first trigger the pre-charge process, a subsequent wordline control signal may trigger the wordline activation, and a subsequent sense control signal may trigger the sense amplifier activation. In other cases, a different order may be used. In some cases, the sense control signal may dictate the time for capturing bitline data from Bitlines 110 and 112 into a latch. In some exemplary embodiments, the wordline control signal may be triggered only in case Bitlines 110 and 112 are equally charged, e.g., so that the delta between the bitlines is easily and swiftly detected. In some exemplary embodiments, it may be desired that the sense control signal would only be triggered after the wordline signal has sufficient time to propagate to each cell of the memory array that contains Cell 100, and that Bitlines 110 and 112 develop a sufficient voltage delta. In case these conditions are not met, the resulting value detected by the sense amplifier may be erroneous.

It is noted that the disclosed subject matter is exemplified with relation to a specific cell structure of Cell 100, but it is not limited to such a structure. As an example, the disclosed subject matter may relate to a cell comprising additional or fewer transistors per bit compared to Cell 100. As another example, the disclosed subject matter may relate to a cell excluding some of the components of Cell 100, or including additional components.

Referring back to the technical problem, a performance of memory chips may deviate due to process variation, locations of chips within a memory array, high temperatures, aging, or the like. In some exemplary embodiments, SRAM manufacturers may pessimistically incorporate a large margin in the timing parameters, e.g., of the sense control signal, as a provision against worst-case scenarios. In some exemplary embodiments, assuming the worst performance may result with an inefficient utilization of the typical memory chips, memory arrays, or the like. In some exemplary embodiments, it may be desired to overcome such drawbacks.

Another technical problem dealt with by the disclosed subject matter is to time control signals efficiently and reliably, e.g., without incorporating large margins in the timing parameters. In some exemplary embodiments, it may be desired to enhance a delay of a sense control signal which is configured to cause the sense amplifier to obtain the bitlines' voltage and identify a delta between the bitlines. In some exemplary embodiments, identifying an enhanced delay between the previous control signal and the sense control signal may enhance the memory access operation.

Yet another technical problem dealt with by the disclosed subject matter is to determine an enhanced ratio between an operation state of a clock cycle and a pre-charge state of the clock cycle. In some exemplary embodiments, the clock cycle of memory arrays may be coarsely divided into an evaluation (EVAL) process, comprising an operation cycle portion in which the wordline is activated to connect the bitlines to the loops, the sense amplifier is activated (e.g., via the sense control signal), or the like, and a pre-charge (PRECHARGE) process, comprising an preparation cycle portion in which the pre-charge process is performed. In some exemplary embodiments, determining a ratio between EVAL and PRECHARGE processes, or a time of partition there between, may be crucial for both reliability and performance of the memory array. In some exemplary embodiments, it may be desired to provide an enhanced time partition that provides a sufficient amount of time for the EVAL portion to reliably perform read or write operations, while limiting excess time of the PRECHARGE process, which may degrade the overall memory access time.

In some exemplary embodiments, a naïve solution for determining the EVAL/PRECHARGE ratio may include using simulations that emulate the EVAL and PRECHARGE processes, and determine a target ratio that retains reliability in worse case scenarios based on the results. In some exemplary embodiments, the simulations may emulate the expected process behavior, and the expected time that is necessary for the process. In some exemplary embodiments, this naïve approach may have one or more drawbacks, e.g., since in order to maintain reliability, process variability may be assumed at a worst case scenario. In some exemplary embodiments, assuming the worst performance may result with an inefficient utilization of the typical memory chips, arrays, or the like, or the high performing chips, or the like. In some exemplary embodiments, determining the EVAL/PRECHARGE ratio based on the simulations may not enable to adapt the ratio to changing conditions such as aging of the cells, and may not enable to extend their life span.

Yet another technical problem dealt with by the disclosed subject matter is to provide an enhanced EVAL/PRECHARGE ratio, an enhanced control signal delay, or the like, that is adaptive and modifiable during runtime of a memory unit, chip, or the like. In some exemplary embodiments, a performance of SRAM memory chips may degrade overtime, e.g., due to excess temperatures and voltage. In some exemplary embodiments, it may be desired to provide an adaptive manner of controlling timing parameters that are crucial for SRAM array operation, so that the timing parameters are matched in real time to the condition of the memory cells.

One technical solution is providing a mechanism that self-configures or adapts timing parameters of memory arrays such as SRAM arrays, SRAM units, SRAM chips, or the like, based on a measured performance of the array itself. In some exemplary embodiments, a delay for a control signal of an array, a delay dictating a ratio between the EVAL process and the PRECHARGE process of an array, or the like, may be determined based on actual measured performances of the SRAM array. In some exemplary embodiments, the term "delay" may refer to a time delay from a start of an active cycle, from a certain control signal, or the like, until triggering a target control signal such as a sense control signal, a control signal differentiating between the EVAL process and the PRECHARGE process, or the like. In some exemplary embodiments, crucial timing parameters that may be adapted may comprise the sense control signal, the pre-charge control signal, the wordline control signal, a control signal differentiating between the EVAL and the PRECHARGE processes, or the like. In some exemplary embodiments, the memory-cell array may be part of a RAM, an SRAM, or the like.

In some exemplary embodiments, timing parameters may be adapted, adjusted, or the like, to the measured array performance, in order to reduce latency while maintaining a high degree of reliability. In some exemplary embodiments, the latency may be reduced by taking advantage of existing gaps between the worst-case memory cells and the common-case memory cells, which may exist since most chips are not exposed to the worst-case temperature, do not contain the worst-case cell with the largest latency, or the like. In some exemplary embodiments, the slowest cell for a typical chip or unit may be still faster than that of the worst-case chip of the entire SRAM memory. In some exemplary embodiments, adjusting the delay parameters to measured performance of each individual array or other memory structure may reduce or even eliminate the gap between the worst-case performance and the common-case performance. In some exemplary embodiments, a memory access performance of each memory array may be measured, and a delay of the array may be adjusted to match the performance of the memory array.

In some exemplary embodiments, one or more SRAM arrays or memory structures may be integrated with a self-configuring delay system, e.g., a hardware state machine, or any other hardware or software structure, for measuring its performance and determining an adaptive delay based thereon. In some exemplary embodiments, a hardware-implemented state machine may include one or more registers, combinational logic blocks, and an SRAM array including controlled delay lines, sensing circuits, or the like. In some exemplary embodiments, the state machine may be configured to optimize the timing parameters based on individual conditions of one or more given SRAM memory structures, which may be influenced by cell aging, types of processes executed thereby, exposure to various temperatures, or the like. In some exemplary embodiments, the state machine may enable timing control of the SRAM arrays by automatically setting an enhanced delay of a designated control signal. In some exemplary embodiments, the state machine may be configured to measure an array's performance periodically, at random periods, upon occurrence of an event, upon identifying that a new delay adaption is needed, or the like.

In some exemplary embodiments, a value of a delay parameter that is utilized in an operation of a memory-cell array, e.g., to determine a delay of a control signal, may be adapted. In some exemplary embodiments, the delay parameter may time one or more control signals, thereby influencing a sense control delay, a ratio between an operation portion of a clock cycle and a pre-charge portion of the clock cycle, or the like.

In some exemplary embodiments, in order to adapt the delay parameter to the array's performance, the delay parameter may be initialized with an initial value, e.g., a maximal value comprising a maximal delay that is possible, that is feasible, that is a potential candidate, or the like. In some exemplary embodiments, the delay parameter may be tested to ensure that it is sufficient for performing a read operation or a write operation. In some exemplary embodiments, writing or reading to the memory-cell array may be enabled during the operation portion of the clock cycle, and may be disabled during the pre-charge portion of the clock cycle. In some exemplary embodiments, a first test data may be written into the array, e.g., in a certain location of the array. In some exemplary embodiments, after writing the first test data, the same value that was written may be attempted to be read. In some exemplary embodiments, a second test data may be attempted to be read from the array, e.g., from the same certain location of the array. In some exemplary embodiments, the attempt to read the second test data may be performed during a reading period that is controlled using the initial delay value, e.g., dictating a length of the operation portion of the clock cycle, a delay of generating control signals, or the like.

In some exemplary embodiments, the first test data may be compared with the second test data, e.g., to identify whether they are identical. In some exemplary embodiments, a failure or flaw of the reading operation may cause the second test data to differ from the first test data, thereby indicating that a greater delay is needed. In some exemplary embodiments, a failure of the reading operation may indicate that a shorter delay is needed. In some exemplary embodiments, a success of the reading operation may indicate that the used delay value may be sufficient for the reading operation, and may potentially include excess time.

In some exemplary embodiments, in order to verify that the delay value is in fact sufficiently reliable, the reading operation may be repeated a plurality of times, e.g., a predefined number of times, using the delay value. In some exemplary embodiments, every read operation of a delay setting may be repeated a defined number of times or iterations in order to minimize statistical variation effect, e.g., thereby complying with robustness requirements. In some exemplary embodiments, the predefined number of times may be optimized after statistical readability analysis of the hardware.

In some exemplary embodiments, in case all of the iterative reading operations were successful, this may indicate that the delay may have an excessive value that can be reduced. In some exemplary embodiments, the delay may be decreased, and the decreased value of the delay may be verified as providing sufficient time for the reading operation, e.g., by repeating the reading operation a plurality of times. In some exemplary embodiments, upon reaching a delay value that is insufficient, e.g., resulting with a mismatch between the written data and the read data, the delay may be increased and verified again, until finding a target delay that is has a minimal value that is yet reliable. In some exemplary embodiments, verifying the increased delay a second time may eliminate hysteresis behavior of the desired circuit, e.g., by enforcing a repeated test of the selected setting. In some exemplary embodiments, hysteresis behavior may comprise behavior in one direction differs from behavior in the opposite direction. In some exemplary embodiments, the target delay may be selected and configured to be used as the delay of a control signal controlling the memory array.

In some exemplary embodiments, the adaptive timing mechanism provided by the disclosed subject matter may be used during a runtime phase of a device housing the memory-cell array, during a runtime phase of the memory-cell array itself, or the like, e.g., after a manufacture configures timing parameters for the array. In some exemplary embodiments, in addition to the memory-cell array, the device housing the memory-cell array may comprise one or more additional memory-cell arrays. In some exemplary embodiments, the adaptive timing mechanism provided by the disclosed subject matter may be used or performed for the additional memory-cell arrays. In some exemplary embodiments, adapting the delay parameter's value may be performed in response to an instruction from a user of a computing device comprising the memory-cell array, periodically, upon identifying that adjusting delay value is advantageous, or the like.

One technical effect of utilizing the disclosed subject matter is to provide an adaptive controller that enhances a utilization of SRAM memory. In some exemplary embodiments, rather than over-designing the memory access procedure for the worst-case conditions, the memory arrays are utilized with an adaptive delay based on their actual measured performance, state, or the like.

Another technical effect of utilizing the disclosed subject matter is to provide enhanced memory access to SRAM memory, thereby saving power consumption, computing resources, energy resources, or the like. In some exemplary embodiments, by adjusting the timing configurations to the actual performance, the memory access performance may be enhanced, e.g., reducing the memory access time, reducing the power consumption, or the like. In some exemplary embodiments, processing time or computational time of the disclosed subject matter may not burden the system, e.g., since the disclosed subject matter may not be needed to be frequently performed.

Yet another technical effect of utilizing the disclosed subject matter is reducing the large margin of the memory's timing parameters while preserving the memory access reliability. In some exemplary embodiments, in contrary to software-based solutions, the current subject matter may be implemented as a hardware-based solution, which may be faster and may not depend on system boot procedures. In some exemplary embodiments, the current subject matter may be represented or implemented as a hardware state-machine, which may be robust against transient changes in circuit delay, e.g., due to voltage drop or temperature instability, at least since each write and read experiment is repeated several times, and the final setting is verified repeatedly.

Yet another technical effect of utilizing the disclosed subject matter is providing high reliability memory access functionality to SRAM memory that avoids or prevents hysteresis behavior of the desired circuit, e.g., by enforcing a repeated test of the selected setting.

The disclosed subject matter may provide for one or more technical improvements over any pre-existing technique and any technique that has previously become routine or conventional in the art. Additional technical problem, solution and effects may be apparent to a person of ordinary skill in the art in view of the present disclosure.

Figure 2:
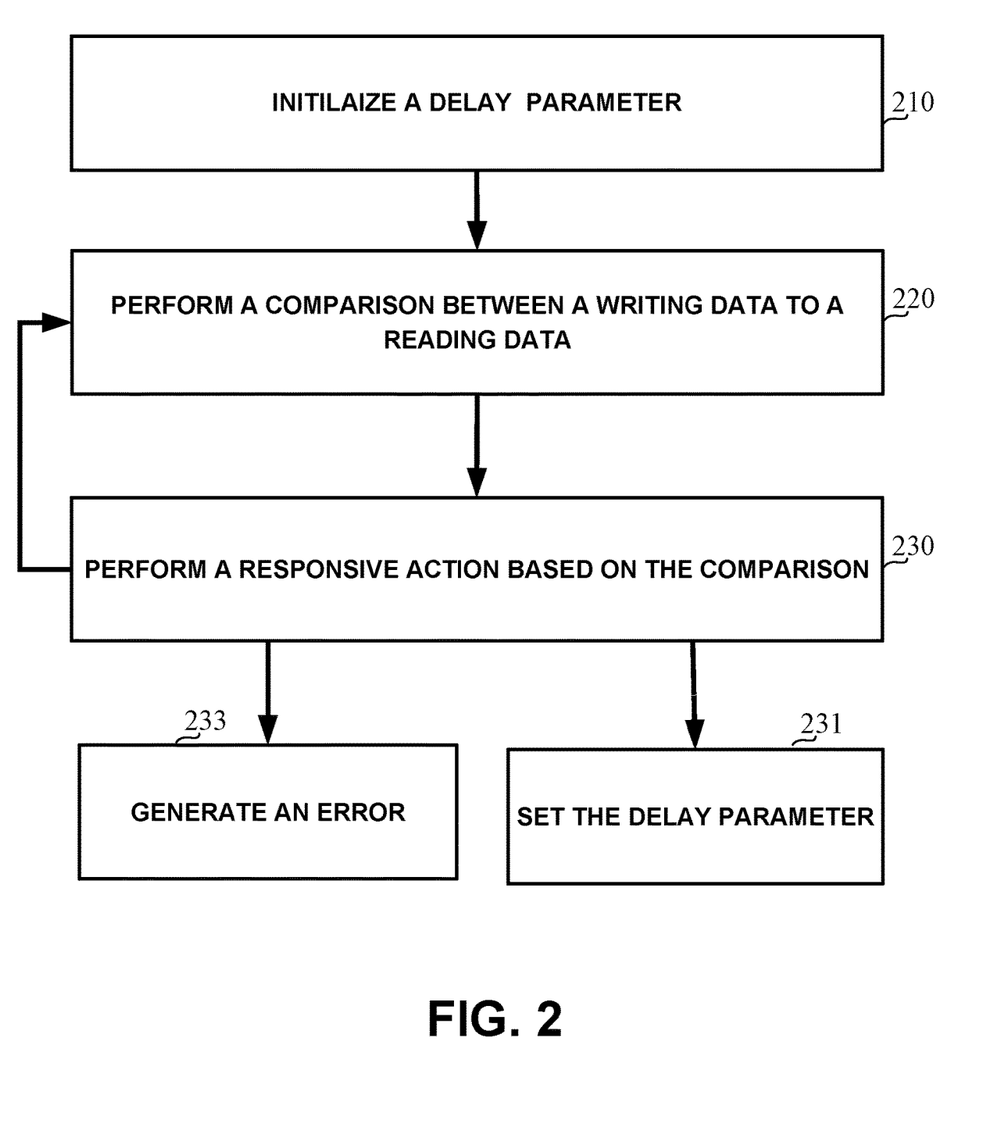
FIG. 2 shows a flowchart diagram of a method, in accordance with some exemplary embodiments of the disclosed subject matter.

Referring now to FIG. 2 showing a flowchart diagram of a method, in accordance with some exemplary embodiments of the disclosed subject matter.

In some exemplary embodiments, a delay parameter may be utilized in operation of a memory-cell array, e.g., comprising one or more SRAM arrays, one or more SRAM structures, one or more SRAM cells, or the like. In some exemplary embodiments, the array may be part of a RAM memory, an SRAM memory, or the like. In some exemplary embodiments, the delay parameter may define a delay of a control signal, such as a sense control signal, a control signal dictating an EVAL/PRECHARGE ratio between an operation portion of a clock cycle, e.g., the EVAL cycle portion, and a pre-charge portion of the clock cycle, e.g., the PRE-CHARGE cycle portion, or the like. In some exemplary embodiments, writing or reading to the memory-cell array may be enabled during the operation portion of the clock cycle, and disabled during the pre-charge portion of the clock cycle. In some exemplary embodiments, it may be desired to adapt the delay parameter's value of the array, e.g., based on a performance of the array.

In some exemplary embodiments, a plurality of memory structures, memory arrays, or the like, may be tested individually. In some exemplary embodiments, in order to set an enhanced delay parameter for an individual array, a plurality of memory addresses in the array may be tested during a plurality of corresponding experiments, testing phases, or the like. In some exemplary embodiments, each experiment or testing phase of a memory array may correspond to the steps of FIG. 2. In some exemplary embodiments, during each experiment of an array, a memory address in the array may be selected, obtained, or the like, and determined data may be written to the selected memory address in the array. In some exemplary embodiments, the addresses used for testing or measuring a performance of the array may be selected to represent various locations of cells in array, types thereof, or the like, which may represent the entire array although comprising a subset thereof. For example, and addresses may be selected to include internal memory cells of the array, external memory cells of the array, portions of different cells of the array, or the like. In some exemplary embodiments, by testing only certain representing locations in the array, the entire array may not be required to be tested, e.g., thereby saving time, power, or the like. Alternatively, every memory location in the cell may be tested, e.g., sequentially, randomly, or the like.

In some exemplary embodiments, the determined data to be written in a selected memory address may be generated, selected, or the like, e.g., by a data source, a storing register, or the like, and may be configured to be written in the array to measure the array's performance. In some exemplary embodiments, during each experiment or testing phase of a memory address, new test data may be generated, obtained, utilized, or the like. Alternatively, the same test data may be utilized for more than one experiments, for more than one array, or the like. In some exemplary embodiments, the adaptive timing mechanism provided by the disclosed subject matter may be implemented as a hardware finite state machine, in software, or the like.

On Step 210, a delay parameter representing a time delay of a control signal may be initialized. In some exemplary embodiments, the delay parameter may be initialized with an initial value, e.g., a maximal value that is enabled by the bits allocated to the delay parameter. For example, for a delay parameter of 4 bit, 16 values from 0-15 may be enabled to be represented by the parameter, and the value of 15 may be the maximal value. In some exemplary embodiments, the maximal value may represent a largest delay that may be used while potentially enabling functionality of the memory access process, and may be associated with one or more time units, portions thereof, or the like. In some exemplary embodiments, the delay may be defined with respect to a determined range of potential values. In some exemplary embodiments, the range may be sectioned into a number of equal portions that are each represented by a delay value. For example, a range of 1-3 milliseconds may be determined as potential delays, and a delay parameter of value 0 may represent the minimal delay in the range, e.g., 1 millisecond, while a delay parameter of a maximal value, e.g., 15, may represent the maximal delay in the range, e.g., 3 milliseconds.

In some exemplary embodiments, the control signal delay may be set to the maximal determined value of the delay parameter. In some exemplary embodiments, additional parameters that may be utilized for the adaptive memory control process may be initialized. In some exemplary embodiments, an iteration count parameter defining a number of iterations may be initialized, e.g., to zero. In some exemplary embodiments, a final check bit configured to indicate a final check of the delay configuration may be initialized, e.g., to zero. In some exemplary embodiments, the parameters may be initialized with opposite values, e.g., the delay parameter may be initialized with a maximal value and the remaining parameters may be initialized with a minimal value. For the sake of simplicity, the first configuration may be described in more detail.

In some exemplary embodiments, during a first clock cycle comprising a writing period that is not longer than the operation portion of the clock cycle, e.g., as dictated by the delay configuration, first test data may be written into one or more cells of the memory-cell array. In some exemplary embodiments, the first test data may be written at a selected memory address of the array, which may be obtained from one or more address selecting sources, from a storing register, or the like.

On Step 220, after the data writing operation, second test data may be read from the same selected memory address, e.g., during an operation portion of a subsequent clock cycle defined by the delay parameter. In some exemplary embodiments, a reading period for reading the second test data may be scheduled during an operation portion of a clock cycle that is subsequent to the writing clock cycle, in an operation portion of the clock cycle that is dictated or influenced by the delay parameter. In some exemplary embodiments, the reading period may be utilized to attempt to read the second test data from the location of the array to which the first test data was written.

In some exemplary embodiments, a comparison may be performed between the first and second test data, e.g., to identify whether reading the test data was successful using the allocated value of the delay parameter. In some exemplary embodiments, the first test data may be compared with the second test data, e.g., to identify whether or not they are identical. In some exemplary embodiments, in case the first and second test data are identical, this may indicate that the reading was successful, e.g., since the data that was written was read correctly, entirely, or the like. In some exemplary embodiments, in case the first and second test data are different, this may indicate that the reading of the first test data was unsuccessful. In some exemplary embodiments, a target value for the delay parameter may be selected based on the comparison, one or more reading and comparison iterations, calculation derived from one or more comparisons, or the like.

On Step 230, one or more responsive actions may be performed based on the comparison. In some exemplary embodiments, after performing the one or more responsive actions, the flow may return to Step 220 for a subsequent iteration, or alternatively, the flow may continue to Step 231 or Step 233, and the method may terminate.

In some exemplary embodiments, the one or more responsive actions may comprise performing one or more arithmetic comparisons between one or more parameters, and predetermined values, e.g., to identify whether or not one or more conditions are fulfilled, complied with, or the like. In some exemplary embodiments, the one or more parameters may comprise the delay parameter, the iteration count parameter, the final check bit, or the like. In some exemplary embodiments, each arithmetic comparison may comprise a comparison between a parameter and a predetermined value, e.g., a maximum value of a parameter, a minimum value of a parameter, or the like. In some exemplary embodiments, based on a status of the conditions, a value of one or more parameters may be adjusted, modified, or the like, e.g., as part of the responsive actions.

In some exemplary embodiments, in case the comparison of Step 220 has failed, resulted in a mismatch, or the like, this may indicate that the delay configuration does not provide sufficient time, and should therefore be increased. In some exemplary embodiments, in case the delay cannot be increased due to having the maximal possible delay value, the flow may continue to Step 233. In some exemplary embodiments, in case the delay can potentially be increased, the delay parameter may be increased, the iteration count parameter may be reset to 0, e.g., to start a new set of iterations, and the final check bit may be turned on to 1, true, or the like. In some exemplary embodiments, as the iteration count parameter is set to zero, the new delay value may be required to perform all of the iterations successfully, from iteration number zero to the maximal iteration number. In some exemplary embodiments, setting the final check bit to one may indicate that a minimal value that is not sufficient was found, and there is no need to reduce the delay value in the future. In some exemplary embodiments, the flow may return with the new parameter values to Step 220.

In some exemplary embodiments, in case of a failure of the comparison that occurs for a delay configuration, after a previous delay value that was greater in one time unit than the delay configuration was found to be successful, the previous delay value may not be automatically selected. In some exemplary embodiments, instead of using the previous delay value that did provide a match, the delay parameter may be increased by one tome unit to the previous value, and may be fully tested again, e.g., thereby enhancing a reliability, a stability, and a safety of the delay configuration. In some exemplary embodiments, the increased delay may be verified, e.g., by ensuring that when using the delay, performing full iterations of the read-compare cycle results in a match. In some exemplary embodiments, the delay parameter's value may be iteratively increased until having a value that results in a comparison match for all iterations.

In some exemplary embodiments, in case the comparison of Step 220 has succeeded, resulted in a match, or the like, this may indicate that the delay configuration may include excess time, and may be therefore decreased, e.g., unless the final check bit is turned on, indicating that the delay cannot be reduced further. In some exemplary embodiments, before decreasing the delay parameter's value, it may be desired to identify that the delay's success is stable, e.g., that when performing the maximal number of iterations using the current delay, all of them will result in a match.

In some exemplary embodiments, upon identifying a match at Step 220, the value of the iteration count parameter may be compared to a maximal value thereof. For example, in case the iteration count parameter is allocated 2 bits, the possible values for the parameter may range between 0-3, and the maximal value may be 3. In some exemplary embodiments, in case the value of the iteration count parameter is lower than the maximal value, the iteration count parameter may be increased by one and the flow may continue to Step 220, using the modified value of the iteration count parameter, e.g., until all of the iteration have been performed.

In some exemplary embodiments, in case Step 220 resulted in a match, and the iteration count parameter complies with the maximal value, is identical thereto, or the like, e.g., indicating that the delay's success is stable, additional calculations and adjustments may be performed. In some exemplary embodiments, the compliance of the iteration count parameter may indicate that the delay value provides sufficient reading time that can be relied upon, e.g., since all the iterations were performed using the delay value were successful. In some exemplary embodiments, in case the delay value is identical to the minimal delay value, and therefore cannot be reduced any further, the delay value may be determined to be the target delay value, and the flow may continue to Step 231. In some exemplary embodiments, in case the final check bit is turned on, indicating that the delay cannot be reduced, the delay value may be selected, and the flow may continue to Step 231. In some exemplary embodiments, otherwise, in case the delay value is not equal to minimal delay value, e.g., is greater than the minimal delay value, and the final check bit is turned off, this may indicate that the delay can be further reduced, decreased, or the like. In such cases, the delay parameter may be deceased by one unit, the iteration count parameter may be reset to zero, e.g., to initiate a new iteration set, and the flow may return to Step 220, using the modified values of the parameters.

In some exemplary embodiments, the flow may continue to Step 231 upon identifying a desired delay, and the method may be terminated. In some exemplary embodiments, the identified delay value may be utilized to set or adjust the delay of a control signal of the tested array. In some exemplary embodiments, a delay value may be identified as being a target delay, a desired delay, a final delay, or the like, in case the delay value is determined to be the minimal value that produces a match for a full set of reading-comparing iterations, and in case the delay value has passed a final check phase, in which the delay was insufficient.

In some exemplary embodiments, the flow may continue to Step 233 upon identifying an error, and the method may be terminated. In some exemplary embodiments, an error may be identified upon determining that the comparison of Step 220 results with a mismatch, but the delay settings that were used include the largest delay configuration. In some exemplary embodiments, in such cases, the testing may be initialized again with a different address in the array, the testing may be initialized again with the same address in the array, the maximal delay may be used again, the delay configurations may be modified, e.g., to increase the maximal delay, or the like.

Figure 3:
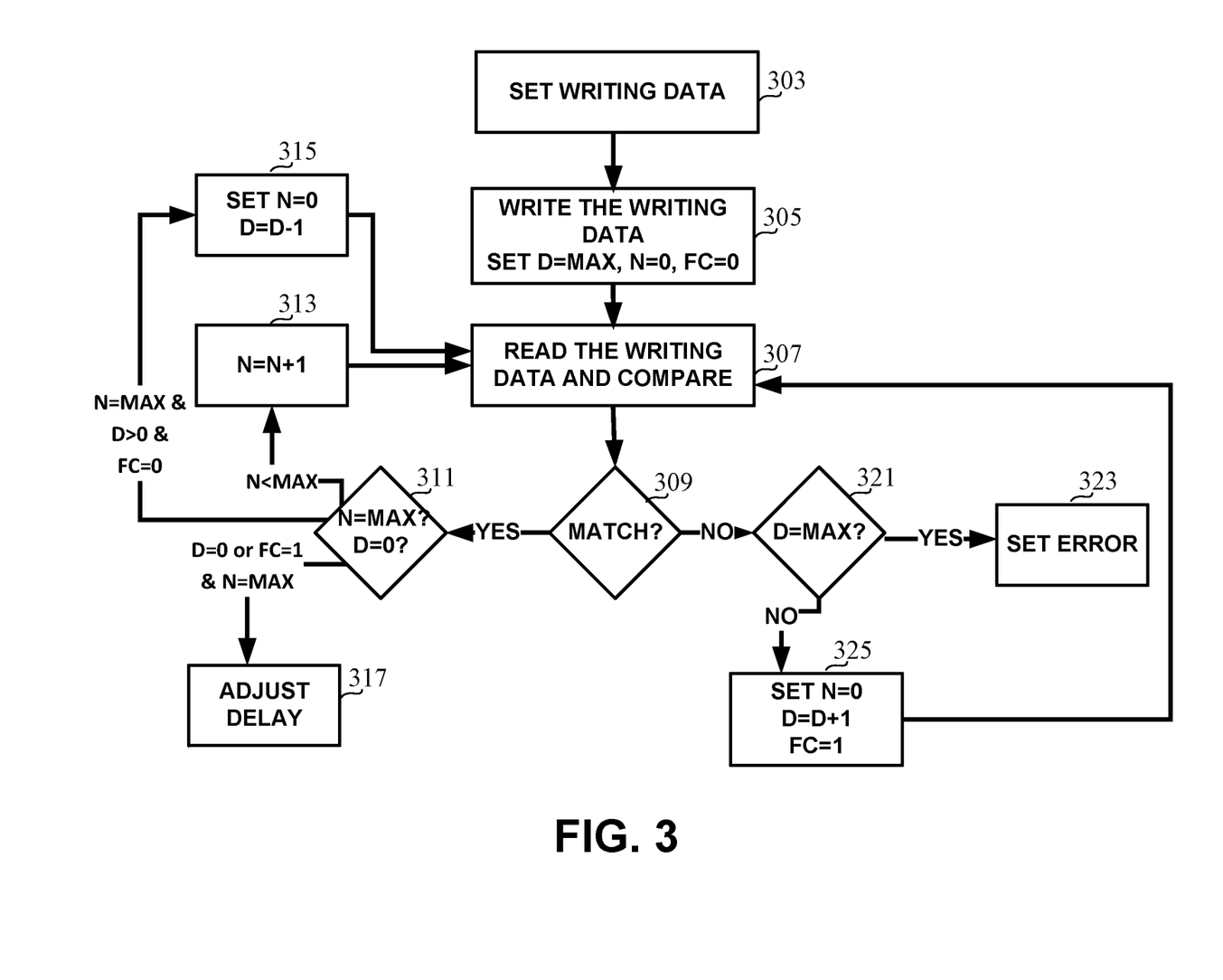
FIG. 3 shows a flowchart diagram of a method, in accordance with some exemplary embodiments of the disclosed subject matter.

Referring now to FIG. 3 showing a flowchart diagram of a method, in accordance with some exemplary embodiments of the disclosed subject matter.

On Step 303, writing data may be determined, obtained, generated, or the like. In some exemplary embodiments, the writing data may include at least one datum comprising a determined value, a randomly generated value, a pre-defined value, an inputted value, or the like. In some exemplary embodiments, the writing data may be set or defined as first test data that is to be written to a tested cell portion of a designated array for which a performance is measured.

On Step 305, the writing data may be written to the memory address of the tested cell portion. In some exemplary embodiments, when writing the data, a maximal delay configuration may be used, e.g., to ensure that the writing operation has sufficient time to be performed.

In some exemplary embodiments, initial setting of parameters used in the delay-adapting process may be determined, defined, or the like, e.g., similarly to Step 210 of FIG. 2. In some exemplary embodiments, a delay parameter representing a delay of the clock cycle may be initialized, defined, or the like, to a maximal value. In some exemplary embodiments, an iteration parameter (also referred to as an "iteration count parameter") defining a number of iterations to be performed may be initialized, e.g., to an initial value of logical 0, false, or the like. In some exemplary embodiments, a final check parameter may be initialized, e.g., to include a logical 0, false, or the like.

On Step 307, reading data may be read from the memory address of the tested cell portion. In some exemplary embodiments, reading the data may be performed at an operation cycle portion that is timed by the delay parameter. In some exemplary embodiments, the writing data may be compared to the reading data, e.g., to identify whether they are different or identical.

On Step 309, the comparison results of Step 307 may be used to split the flow direction. In case the writing data and the reading data are found to be identical, the flow may continue to Step 311. In case the writing data and the reading data are found to be different, the flow may continue to Step 321.

On Step 311, comparison results between parameters and determined values may be used to further split the flow direction. In case the iteration parameter is lower than a maximal value of the parameter, the flow may continue to Step 313. In case the iteration parameter is equal to a maximal value of the iteration parameter, the delay parameter is greater than zero (or another minimal delay value), and the final check parameter is equal to zero, the flow may continue to Step 315. In case the iteration parameter is equal to a maximal value of the parameter, and the delay parameter is equal to zero (or another minimal delay value), the flow may continue to Step 317. In case the iteration parameter is equal to a maximal value of the parameter, and the final check parameter is set to 1, the flow may continue to Step 317.

On Step 313, the iteration parameter may be increased by one, and the flow may return to Step 307, e.g., for a next iteration.

On Step 315, the iteration parameter may be set to zero, the delay parameter may be decreased by one delay unit, and the flow may return to Step 307.

On Step 317, the delay of the array may be adjusted to the delay parameter's value, e.g., as the target delay configuration.

On Step 321, comparison results between parameters and determined values may be used to further split the flow direction. In case the delay parameter is equal to a maximal delay value, the flow may continue to Step 323. In case the delay parameter is not equal to a maximal delay value, the flow may continue to Step 325.

On Step 323, an error bit may be set.

On Step 325, the delay parameter may be increased by one delay unit, the iteration parameter may be set to zero, the final check parameter may be set to 1, and the flow may return to Step 307.

Figure 4:
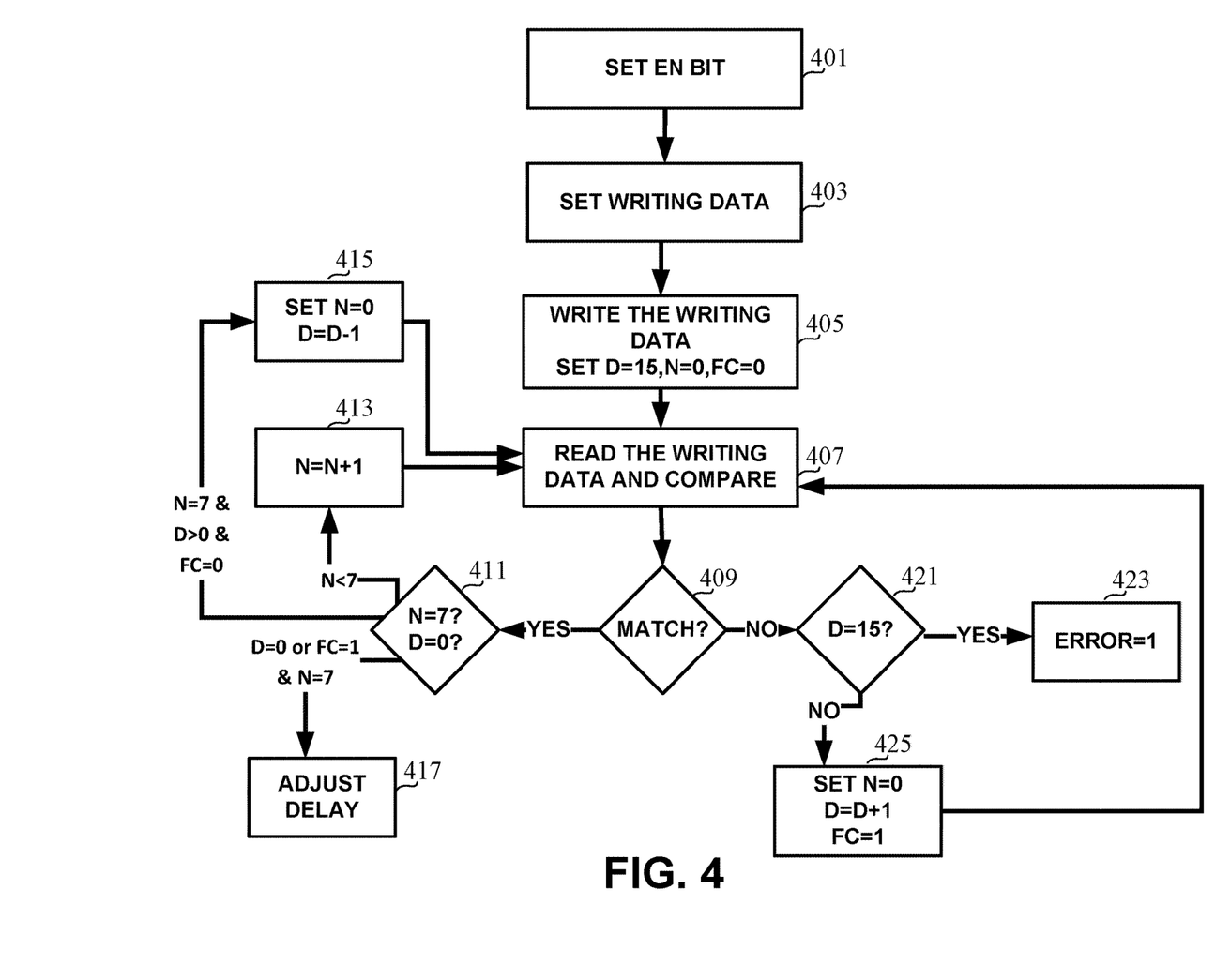
FIG. 4 shows a flowchart diagram of a method, in accordance with some exemplary embodiments of the disclosed subject matter.

Referring now to FIG. 4 showing a flowchart diagram of an exemplary scenario of the method of FIG. 3, in accordance with some exemplary embodiments of the disclosed subject matter.

In some exemplary embodiments, a delay parameter, denoted 'd', may represent a delay setting. In some exemplary embodiments, in the illustrated scenario, the delay parameter comprises an arbitrary number of 4 bits, enabling to represent 16 various delay settings, e.g., delay 0-15. In some exemplary embodiments, any other number of bits may be allocated to represent the delay.

In some exemplary embodiments, an iteration count parameter, denoted 'n', may refer to a number of iterations for repeating WRITE/READ experiments for each selected delay setting. In some exemplary embodiments, in the illustrated scenario, the iteration count parameter comprises an arbitrary number of 3 bits, enabling to represent 8 iterations, e.g., iteration 0-7. In some exemplary embodiments, any other number of bits may be allocated to represent the iteration count. In some exemplary embodiments, the allocated number of bits may be optimized based on statistical readability analysis of the hardware, e.g., the SRAM unit.

In some exemplary embodiments, an Enable-bit (EN), may refer to enabling writing access to one or more locations of the tested array. In some exemplary embodiments, in case the EN bit is set to a logical "1", or true, the method may be performed. In some exemplary embodiments, the EN bit may be turned on, or set to 1, periodically, based on an input, based on a detected event, based on a user instruction, based on a heuristic, or the like.

In some exemplary embodiments, at Step 401, the EN bit may be set to true, logical 1, or the like, e.g., in case a delay adaption is desired.

In some exemplary embodiments, at Step 403, first test data that is configured to be written may be determined, defined, generated, or the like. In some exemplary embodiments, a destination address in the array, to which the first test data is configured to be written, may be selected.

In some exemplary embodiments, at Step 405, the first test data that was prepared at Step 403 may be written to the destination address of the SRAM unit. In some exemplary embodiments, the timing parameters may be initialized. In some exemplary embodiments, the delay parameter may be set to an initial value representing a maximal delay value, e.g., a value of 15. In some exemplary embodiments, the iteration count parameter and the final check bit may be set to logical zero, off, or the like.

In some exemplary embodiments, at Step 407, second test data may be read from the array address and compared to the first test data.

In some exemplary embodiments, at Step 409, the flow may continue to Step 411 in case that the first test data matches the second test data, and to Step 421 in case that the first and second test data do not match.

In some exemplary embodiments, at Step 411, the flow may continue to Step 413 in case the iteration count parameter is below the iteration threshold of 7. In some exemplary embodiments, in case the iteration count parameter reached the iteration threshold of 7, Step 411 may evaluate the delay parameter and the final check bit. In some exemplary embodiments, in case the delay parameter is above a minimal delay value, e.g., zero, and the final check bit is off, the flow may continue to Step 415. Otherwise, e.g., in case the delay parameter has a minimal delay value, or the final check bit is turned on, the flow may continue to Step 417.

In some exemplary embodiments, at Step 413, the iteration count parameter may be increased by one iteration, and the flow may return to Step 407.

In some exemplary embodiments, at Step 415, the delay parameter may be decreased by one, the iteration count parameter may be initialized to zero, and the flow may transition back to Step 407.

In some exemplary embodiments, at Step 417, the delay parameter may selected as the final delay of the SRAM array.

In some exemplary embodiments, at Step 421, it may be determined whether the delay parameter has a value that is equal to the maximal delay value of 15. In some exemplary embodiments, in case the delay parameter has a value that is equal to 15, the flow may transition to Step 423. In some exemplary embodiments, in case the delay parameter has a value that is below 15, the flow may transition to Step 425.

In some exemplary embodiments, at Step 423, an error bit may be turned on, e.g., generating an error.

In some exemplary embodiments, at Step 425, the delay parameter may be increased by 1. In some exemplary embodiments, the final check bit may be turned on. In some exemplary embodiments, the iteration count parameter may be set to zero, and the flow may transition back to Step 407.

Figure 5:
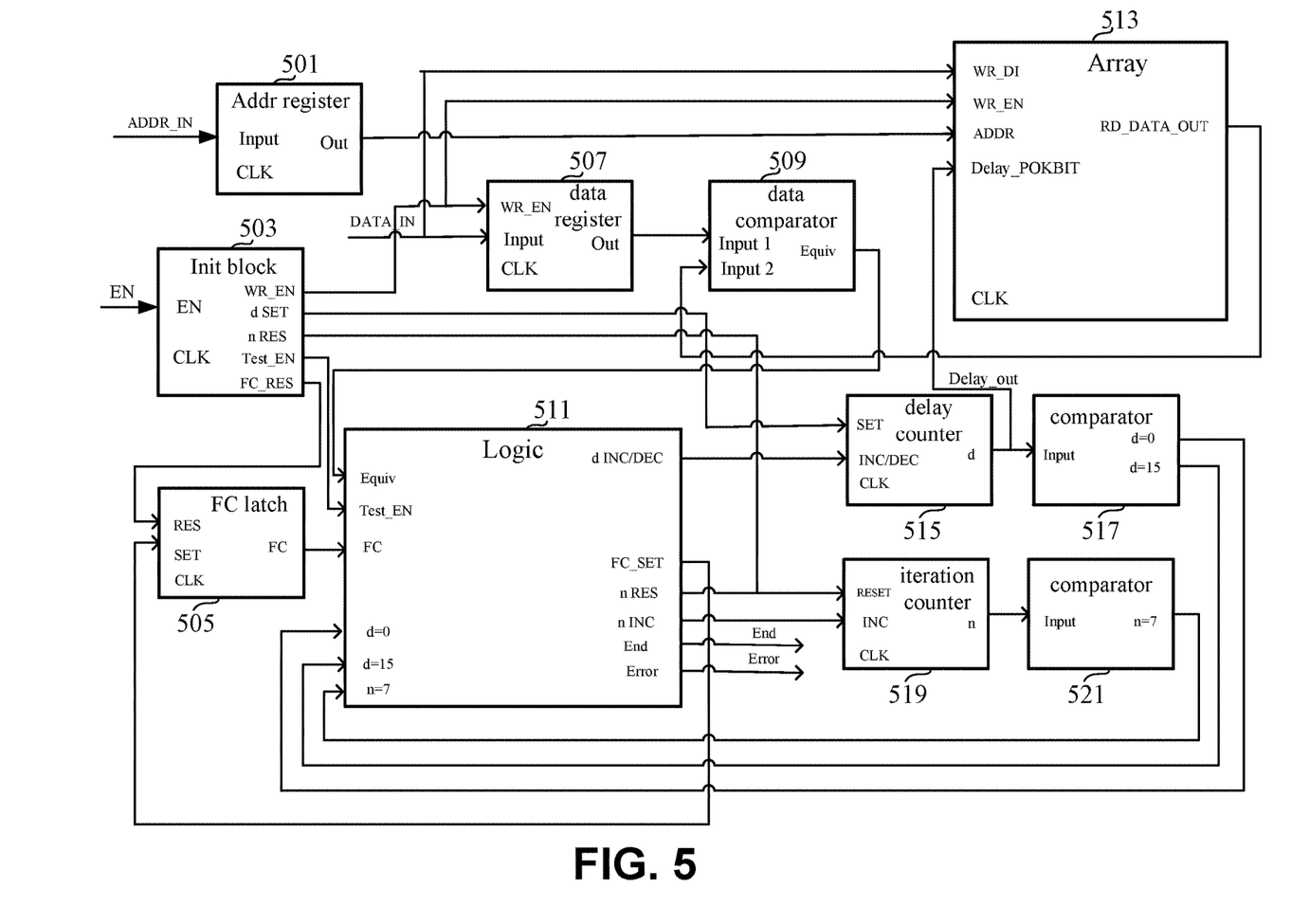
FIG. 5 shows a schematic memory structure of a hardware-implemented state machine, in accordance with some exemplary embodiments of the disclosed subject matter.

Referring now to FIG. 5 showing a schematic memory structure of a state machine according to the exemplary scenario of FIG. 4, in accordance with some exemplary embodiments of the disclosed subject matter.

In some exemplary embodiments, State Machine 500 may illustrate an exemplary hardware implementation of a finite state machine that may be utilized in a self-configuring delay system. In some exemplary embodiments, State Machine 500 may comprise a plurality of hardware components such as logical structures, memory structures, registers, or the like, e.g., as can be appreciated from FIG. 5. In some exemplary embodiments, at least some of the components of State Machine 500 may be activated directly or indirectly based on a clock (CLK) signal.

In some exemplary embodiments, Address Register 501 may obtain an address input (denoted ADDR_IN) comprising a memory location in the tested memory array, e.g., Array 513. In some exemplary embodiments, an address provider providing the address may be configured to select addresses that represent various locations of cells in Array 513. In some exemplary embodiments, the address may be obtained via a signal from the address provider. In some exemplary embodiments, Address Register 501 may store the current memory address and forward the memory address to Array 513, e.g., to locate the tested memory cells in Array 513.

In some exemplary embodiments, Initializing (Init) Block 503 may initiate the self-configuring delay process upon obtaining an Enable (EN) bit that is set to true, logical 1, or the like, indicating that writing access is enabled to location addresses retained at Address Register 501, in order to measure a performance of the located memory cells. In some exemplary embodiments, based on the EN bit, Init Block 503 may generate a writing enablement signal indicating that writing to Array 513 is enabled. In some exemplary embodiments, the writing enablement signal may be forwarded to Data Register 507 and to Array 513. In some exemplary embodiments, Init Block 503 may provide a test enablement bit to Logic block 511, e.g., to indicate that Logic block 511 should be enabled to function, e.g., performing logical operations to determine an adjustment of the delay parameter.

In some exemplary embodiments, Init Block 503 may initialize or set one or more timing parameters, e.g., a delay parameter, an iteration count parameter, a final check bit, or the like. In some exemplary embodiments, Init Block 503 may set the delay parameter, denoted 'd', which may comprise 4 bits in the current scenario, to a maximal value of 15. In some exemplary embodiments, Init Block 503 may provide the delay to Delay Counter 515, e.g., via a delay signal. In some exemplary embodiments, Delay Counter 515 may initially output the initial delay of 15 (as Delay_out). In some exemplary embodiments, Init Block 503 may initialize the iteration count parameter, denoted 'n', which may comprise 3 bits in the current scenario, to a minimal value of zero. In some exemplary embodiments, Init Block 503 may provide the iteration count to Iteration Counter 519, e.g., via a signal. In some exemplary embodiments, Init Block 503 may initialize the final check bit, denoted FC, to logical zero, false, or the like. In some exemplary embodiments, the final check bit may be turned on upon finding a delay parameter and searching for a safe and stable upper bound thereof. In some exemplary embodiments, Init Block 503 may provide the final check value with the initialized value to FC Latch 505, e.g., via a signal. In some exemplary embodiments, FC Latch 505 may obtain the final check value from Init Block 503, and provide the value to Logic block 511.

In some exemplary embodiments, Data Register 507 may obtain the writing enablement signal from Init Block 503, and a data input signal (denoted DATA_IN) which may comprise predetermined test data, random data, or the like, that is to be written in Array 513, from a data provide, e.g., external to the state machine. In some exemplary embodiments, Data Register 507 may store the data and provide a signal comprising the data to Data Comparator 509 as a first input thereto. In some exemplary embodiments, Data Comparator 509 may be configured to obtain two data inputs, compare between them, and output whether or not they are equal, identical, or the like.

In some exemplary embodiments, Array 513 may obtain the writing enablement signal from Init Block 503, the data signal from a data source, and the memory address from Address Register 501. In some exemplary embodiments, Array 513 may obtain a delay power okay bit (Delay_POK-BIT) from Delay Counter 515, e.g., initially having the value of the delay parameter, e.g., 15, and write the data from the data source to the memory address in Array 513 that is specified by Address Register 501, during an EVAL cycle portion that uses the obtained delay configuration.

In some exemplary embodiments, after writing the data, Array 513 may attempt to read a same data from the same memory address, e.g., during a subsequent EVAL cycle portion with a same delay that is dictated by the obtained delay. In some exemplary embodiments, Array 513 may provide the reading data (denoted RD_DATA_OUT) to Data Comparator 509, e.g., as a second data input in addition to the first data input comprising the original data signal.

In some exemplary embodiments, Data Comparator 509 may compare the first input, comprising the data input from the data source, with the reading data that was read from Array 513. In some exemplary embodiments, Data Comparator 509 may output a signal indicating whether the data input matches the reading data and provide the signal to Logic block 511. For example, Data Comparator 509 may provide a logical 1 in case the reading data matches the original data, and a logical 0 in case they do not match, or vice versa.

In some exemplary embodiments, Logic block 511 may obtain the test enablement bit from Init Block 503, the comparison result from Data Comparator 509, and the final check bit comprising at first the initial value of 0 from FC Latch 505. In some exemplary embodiments, Logic block 511 may determine whether the delay parameter should be increased or decreased based on the obtained inputs. In some exemplary embodiments, in the first iteration, in case the comparison result indicates a mismatch, Logic block 511 may output an error, e.g., since the delay that was utilized for the writing and reading operations represents the maximal delay of 15 that cannot be increased. In some exemplary embodiments, in the first iteration, in case the comparison result indicates a match, Logic block 511 may output a signal to increases the iteration count parameter at Iteration Counter 519, e.g., until reaching a maximal iteration count of 7.

In some exemplary embodiments, Iteration Counter 519 may obtain a signal to reset or increases the iteration count parameter from Logic block 511, and perform the requested arithmetic action to the iteration count parameter. In some exemplary embodiments, Iteration Counter 519 may output the modified iteration count parameter to Comparator 521.

In some exemplary embodiments, Comparator 521 may obtain the iteration count value and compare the iteration count to the maximum value, e.g., to 7. In some exemplary embodiments, in case the iteration count matches the maximum value, Comparator 521 may provide a corresponding signal to Logic block 511, e.g., indicating that the number of iterations complies with the maximal defined number. Otherwise, Comparator 521 may not provide an output.

In some exemplary embodiments, each iteration, Array 513 may perform additional reading iterations of the written data, e.g., using the delay configuration. In some exemplary embodiments, the reading values may be compared with the original data at Data Comparator 509, and the comparison results may be provided to Logic block 511 to perform calculations.

In some exemplary embodiments, during the last successful iteration, e.g., the seventh iteration, Logic block 511 may be provided with a signal from Comparator 521, indicating that 7 iterations have been performed. In some exemplary embodiments, in case the comparison result indicates a match, the final check parameter is turned off, and the iteration is the last iteration, a signal indicating that the delay parameter is to be decreased may be provided to Delay Counter 515.

In some exemplary embodiments, Delay Counter 515 may obtain the delay signal from Init Block 503, and a delay increase or decrease signal from Logic block 511. In some exemplary embodiments, Delay Counter 515 may determine a resulting delay based on its inputs, and output the resulting delay to Array 513 and to Comparator 517. In some exemplary embodiments, the resulting delay may be used to dictate the delay of reading from Array 513 in the next iterations.

In some exemplary embodiments, Comparator 517 may obtain the resulting 20 delay from Delay Counter 515 and compare the delay to the minimum and maximum values, e.g., to 0 and 15. In some exemplary embodiments, in case the delay matches the extreme values, Comparator 517 may provide a corresponding signal to Logic block 511. Otherwise, Comparator 517 may not provide an output.

In some exemplary embodiments, in case Logic block 511 obtains comparison results that indicate a mismatch, and receives from Comparator 517 an indication that the delay parameter has a maximal value, e.g., 15, an error may be generated.

In some exemplary embodiments, in case Logic block 511 obtains comparison results that indicate a mismatch, and does not receive from Comparator 517 an indication that the delay parameter has a maximal value, e.g., 15, a delay signal indicating that the delay value should be increased may be provided to Delay Counter 515, an iteration reset signal may be provided to Iteration Counter 519 to indicate that the iteration count parameter should be reset to zero, and a final count signal indicating that the FC bit should be turned on or set to 1, may be provided to FC Latch 505. In some exemplary embodiments, FC Latch 505 may provide the updated FC value to Logic block 511 in a next iteration. In some exemplary embodiments, a new reading iteration may be performed at Array 513.

In some exemplary embodiments, in case Logic block 511 obtains comparison results that indicate a match, and does not receive from Comparator 521 an indication that the iteration count parameter has a maximal value, e.g., 7, Logic block 511 may output a signal to increase the iteration count parameter at Iteration Counter 519, for example, until the iteration count reaches 7. In some exemplary embodiments, a new reading iteration may be performed at Array 513.

In some exemplary embodiments, in case Logic block 511 obtains comparison results that indicate a match, and receives from Comparator 521 an indication that the iteration count parameter has a maximal value, e.g., 7, Logic block 511 may identify whether the FC value obtained from FC Latch 505 is true or false, or whether Comparator 517 provides a signal indicating that the delay parameter has reached the minimal value, e.g., 0. In case the FC value is 1, or the delay parameter is 0, Logic block 511 may end the state machine's operation and produce a success ending signal. In some exemplary embodiments, the final delay configuration of Array 513 may be adjusted according to the delay parameter.

Otherwise, e.g., in case the FC value is 0 and the delay parameter is greater than 0, an iteration reset signal may be provided to Iteration Counter 519 to indicate that the iteration count parameter should be reset to zero, and a delay signal indicating that the delay value should be decreased may be provided to Delay Counter 515. In some exemplary embodiments, a new reading iteration may be performed at Array 513.

In some exemplary embodiments, the state machine implementation of FIG. 5 may be implemented in any other way, using any other parameter sizes, data structures, data communication paths, or the like.

Figure 6:
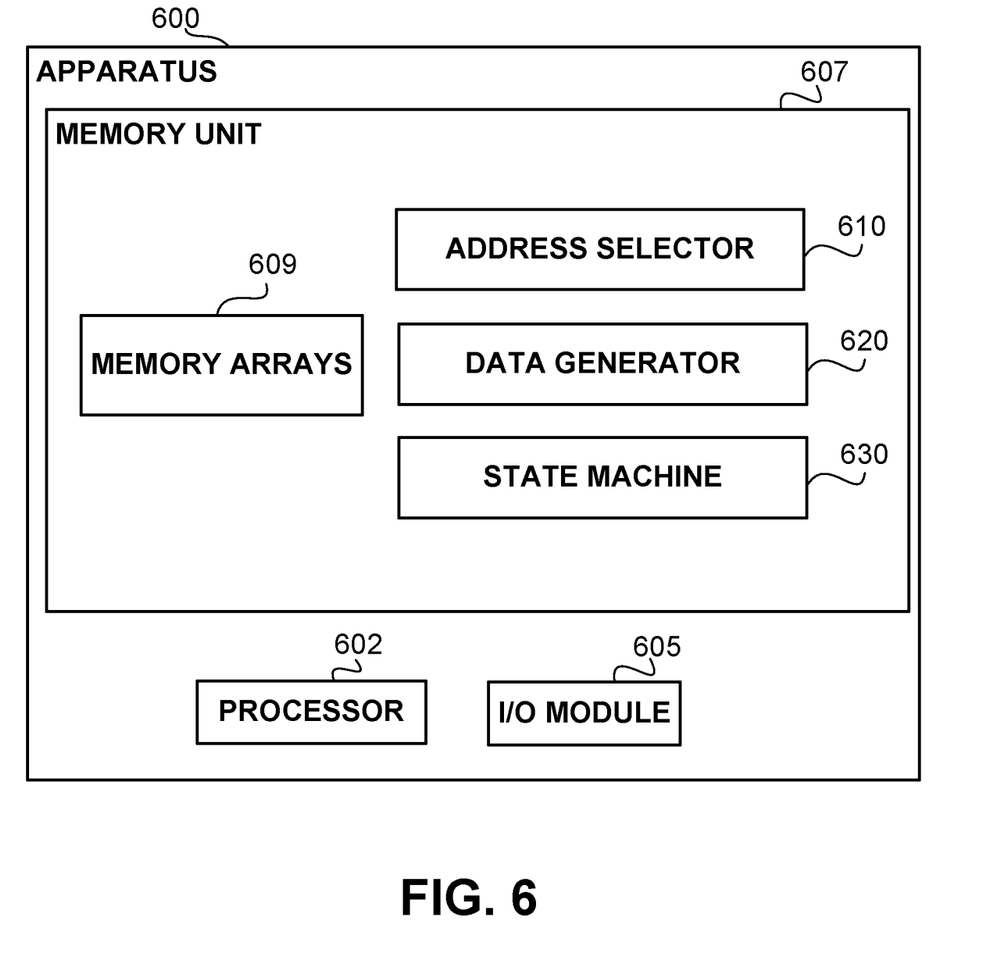
FIG. 6 shows a block diagram of an apparatus, in accordance with some exemplary embodiments of the disclosed subject matter.

Referring now to FIG. 6 showing a block diagram of an apparatus, in accordance with some exemplary embodiments of the disclosed subject matter.

In some exemplary embodiments, an Apparatus 600 may comprise a Processor 602. Processor 602 may be a Central Processing Unit (CPU), a microprocessor, an electronic circuit, an Integrated Circuit (IC) or the like. Processor 602 may be utilized to perform computations required by Apparatus 600 or any of its subcomponents. Processor 602 may be configured to execute computer-programs useful in performing the methods of FIGS. 2-4, or the like.

In some exemplary embodiments of the disclosed subject matter, an Input/Output (I/O) Module 605 may be utilized to provide an output to and receive input from a user. I/O Module 605 may be used to transmit and receive information to and from the user or any other apparatus, e.g., a plurality of user devices, in communication therewith.

In some exemplary embodiments, Apparatus 600 may comprise a Memory Unit 607. Memory Unit 607 may be a short-term storage device or long-term storage device. Memory Unit 607 may be a persistent storage or volatile storage. Memory Unit 607 may be a disk drive, a Flash disk, a RAM, a SRAM, a memory chip, or the like. In some exemplary embodiments, Memory Unit 607 may retain program code operative to cause Processor 602 to perform acts associated with any of the subcomponents of Apparatus 600. In some exemplary embodiments, Memory Unit 607 may retain program code operative to cause Processor 602 to perform acts associated with any of the steps in FIGS. 2-4, or the like.

In some exemplary embodiments, Memory Unit 607 may comprise Arrays 609. In some exemplary embodiments, Arrays 609 may comprise one or more SRAM cell arrays, chips, structures, units, RAM cell arrays, or the like, which may be designated for delay adaption.

The components detailed below may be implemented as one or more sets of interrelated computer instructions, executed for example by Processor 602 or by another processor. The components may be arranged as one or more executable files, dynamic libraries, static libraries, methods, functions, services, or the like, programmed in any programming language and under any computing environment.

In some exemplary embodiments, Address Selector 610 may be configured to generate a plurality of memory addresses for each tested memory array, e.g., such as the one or more arrays of Arrays 609. In some exemplary embodiments, each memory address may correspond to one or more cells of Arrays 609. In some exemplary embodiments, Address Selector 610 may be configured to generate the memory addresses to comprise random addresses, sequential addresses of the entire Arrays 609, or the like. In some exemplary embodiments, Address Selector 610 may be configured to generate the memory addresses to comprise a representation of Arrays 609, e.g., by selecting various different types of addresses, located on different types of locations in Arrays 609, or the like. In some exemplary embodiments, by generating addresses that represent each array of Arrays 609, Address Selector 610 may enable to reduce the number of areas that are to be tested in Arrays 609.

In some exemplary embodiments, Data Generator 620 may be configured to generate one or more data portions, data values, or the like, that are configured to be written in one or more addresses in Arrays 609, e.g., in memory addresses obtained from Address Selector 610. In some exemplary embodiments, Data Generator 620 may generate separate writing data for each tested memory address in Arrays 609, for one or more tested memory addresses in Arrays 609, for all of Arrays 609 such as by using the same data for all tested memory addresses, or the like. In some exemplary embodiments, Data Generator 620 may provide the generated data to State Machine 630.

In some exemplary embodiments, State Machine 630 may comprise a finite state machine such as the state machine of FIG. 5. In some exemplary embodiments, State Machine 630 may be configured to test areas of Arrays 609 with different delay times, and identify performances that are provided for various delay times. In some exemplary embodiments, using State Machine 630, a delay of Arrays 609 may be adjusted to match the performances of Arrays 609$s'$ cells.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    adapting a value of a delay parameter that is utilized in an operation of a memory-cell array, wherein the delay parameter influences a ratio between an operation portion of a clock cycle and a pre-charge portion of the clock cycle, wherein the clock cycle comprises the operation portion and the pre-charge portion, wherein writing or reading to the memory-cell array is enabled during the operation portion of the clock cycle and is disabled during the pre-charge portion of the clock cycle,
    wherein said adapting comprises:
        initializing the delay parameter with an initial value;
        writing a first test data into the memory-cell array;
        during a reading period that is not longer than the operation portion of the clock cycle, attempting to read from the memory-cell array a second test data;
        comparing the first test data with the second test data; and
        selecting a target value for the delay parameter based on said comparing.

2. The method of claim 1, wherein the first test data is written into a memory address of the memory-cell array, and the second test data is attempted to be read from the memory address.

3. The method of claim 1, wherein in case the first test data is determined to be identical to the second test data, said selecting comprises iteratively:
    repeating a plurality of times said attempting to read and said comparing using the value of the delay parameter, and
    decreasing the delay parameter value to obtain a decreased operation period until said comparing results in a mismatch.

4. The method of claim 3, wherein said selecting comprises, upon identifying that said comparing results in the mismatch:
    increasing the value of the delay parameter, and
    verifying that the value is reliable by repeating a plurality of times said attempting to read and said comparing using the value of the delay parameter, thereby preventing hysteresis behavior.

5. The method of claim 1, wherein in case the first test data is not identical to the second test data, said selecting comprises:
    increasing the delay parameter value to obtain an increased operation period, and
    repeating a plurality of times said attempting to read and said comparing using the increased operation period.

6. The method of claim 1, wherein the delay parameter represents a delay of a control signal associated with the clock cycle.

7. The method of claim 1 performed during runtime of a device housing the memory-cell array, wherein the runtime is after a testing phase of the device, wherein said adapting is performed in response to an instruction from a user of a computing device comprising the memory-cell array.

8. The method of claim 1 performed during runtime of a device housing the memory-cell array, wherein the runtime is after a testing phase of the device.

9. The method of claim 1 performed at a device housing the memory-cell array and one or more additional memory-cell arrays, wherein said adapting is further performed for each of the one or more additional memory-cell arrays.

10. The method of claim 1, wherein said adapting is performed in response to an instruction from a user of a computing device comprising the memory-cell array.

11. The method of claim 1, wherein the initial value comprises a maximal value of the delay parameter.

12. The method of claim 1, wherein the memory-cell array is part of a Random-access memory (RAM).

13. The method of claim 12, wherein the memory-cell array is part of a Static RAM (SRAM).

14. A computer program product comprising a non-transitory computer readable storage medium retaining program instructions, which program instructions when read by a processor, cause the processor to:
    adapt a value of a delay parameter that is utilized in an operation of a memory-cell array, wherein the delay parameter is used to time one or more control signals for changing a ratio between an operation portion of a clock cycle and a pre-charge portion of the clock cycle, wherein the clock cycle comprises the operation portion and the pre-charge portion, wherein writing or reading to the memory-cell array is enabled during the operation portion of the clock cycle and is disabled during the pre-charge portion of the clock cycle, wherein said adapt comprises:
initialize the delay parameter with an initial value;
write a first test data into the memory-cell array;
during a reading period that is not longer than the operation portion of the clock cycle, attempt to read from the memory-cell array a second test data;
compare the first test data with the second test data; and
select a target value for the delay parameter based on said compare.

15. The computer program product of claim 14, wherein the instructions, when read by the processor, cause the processor to write the first test data into a memory address of the memory-cell array, and to read the second test data from the memory address.

16. The computer program product of claim 14, wherein the delay parameter represents a delay of a control signal associated with the clock cycle.

17. The computer program product of claim 14, wherein the memory-cell array is part of a Static RAM (SRAM).

18. The computer program product of claim 14, wherein the instructions, when read by the processor, cause the processor to, in case the first test data is not identical to the second test data:
increase the delay parameter value to obtain an increased operation period, and
repeat a plurality of times said attempt to read and said compare using the increased operation period.

19. The computer program product of claim 14, wherein the instructions, when read by the processor, cause the processor to, in case the first test data is determined to be identical to the second test data, iteratively:
repeat a plurality of times said attempt to read and said compare using the value of the delay parameter, and
decrease the delay parameter value to obtain a decreased operation period until said compare results in a mismatch.

20. A system comprising a processor and coupled memory, the processor being adapted to:
adapt a value of a delay parameter that is utilized in an operation of a memory-cell array of the coupled memory, wherein the delay parameter influences a ratio between an operation portion of a clock cycle and a pre-charge portion of the clock cycle, wherein the clock cycle comprises the operation portion and the pre-charge portion, wherein writing or reading to the memory-cell array is enabled during the operation portion of the clock cycle and is disabled during the pre-charge portion of the clock cycle, wherein said adapt comprises:
initialize the delay parameter with an initial value;
write a first test data into the memory-cell array;
during a reading period that is not longer than the operation portion of the clock cycle, attempt to read from the memory-cell array a second test data;
compare the first test data with the second test data; and
select a target value for the delay parameter based on said compare.

* * * * *